United States Patent [19]
Fujie et al.

[11] Patent Number: 5,696,623
[45] Date of Patent: Dec. 9, 1997

[54] UV EXPOSURE WITH ELONGATED SERVICE LIFETIME

[75] Inventors: Nobuo Fujie; Hitoshi Obara; Keiji Kuroiwa; Masaki Nakamura; Kazuya Watanabe; Takashi Aruga; Nobutaka Horii; Motokazu Suzuki; Tadahiro Hayashi, all of Kawasaki, Japan

[73] Assignee: Fujitsu Limited, Kawasaki, Japan

[21] Appl. No.: 216,962

[22] Filed: Mar. 24, 1994

[30] Foreign Application Priority Data

| Aug. 5, 1993 | [JP] | Japan | HEI5-194811 |
| Aug. 5, 1993 | [JP] | Japan | HEI5-194812 |
| Dec. 28, 1993 | [JP] | Japan | HEI5-337539 |

[51] Int. Cl.⁶ .............. G03F 7/00; H01L 21/30; G02B 27/00
[52] U.S. Cl. .......... 359/350; 359/509; 359/512; 359/820; 359/900; 355/30; 355/53; 355/67
[58] Field of Search .......... 359/355, 358, 359/507, 509, 512, 665, 667, 820, 350, 900; 355/30, 53, 67

[56] References Cited

U.S. PATENT DOCUMENTS

| 1,969,655 | 8/1934 | Mailey | 359/358 |
| 2,339,906 | 1/1944 | Barnes | 359/358 |
| 4,443,072 | 4/1984 | Ballard | 359/509 |
| 4,616,908 | 10/1986 | King | 359/509 |
| 4,676,614 | 6/1987 | Ohno | 353/101 |
| 4,699,505 | 10/1987 | Komoriya et al. | 355/30 |
| 4,704,348 | 11/1987 | Koizumi et al. | 355/30 |
| 4,730,900 | 3/1988 | Uehara et al. | 359/820 |
| 4,786,947 | 11/1988 | Kosugi et al. | |
| 4,825,247 | 4/1989 | Kemi et al. | 355/30 |
| 4,871,237 | 10/1989 | Anzai et al. | 359/667 |
| 4,974,018 | 11/1990 | Komoriya et al. | 355/30 |
| 5,008,156 | 4/1991 | Hong | 359/507 |
| 5,061,024 | 10/1991 | Keys | 359/507 |
| 5,063,582 | 11/1991 | Mori et al. | 355/53 |
| 5,166,530 | 11/1992 | McCleary | |
| 5,356,739 | 10/1994 | Kawasaki et al. | 359/507 |
| 5,425,045 | 6/1995 | Hamatani | 359/509 |

FOREIGN PATENT DOCUMENTS

| A-2 568 025 | 1/1986 | France. | |
| 0248196 | 7/1987 | German Dem. Rep. | 359/512 |
| 2247139 | 4/1973 | Germany | 359/509 |
| A 60-079357 | 5/1985 | Japan | 355/30 |
| A 60-079358 | 5/1985 | Japan | 355/30 |
| A0245130 | 10/1986 | Japan | 359/512 |
| 62-36819 | 2/1987 | Japan. | |
| 63-86515 | 4/1988 | Japan. | |
| 2-90510 | 3/1990 | Japan. | |
| 3-54818 | 3/1991 | Japan. | |
| 4-22958 | 1/1992 | Japan. | |
| A 04-142727 | 5/1992 | Japan | 355/30 |

*Primary Examiner*—Paul M. Dzierzynski
*Assistant Examiner*—John Juba, Jr.
*Attorney, Agent, or Firm*—Nikaido, Marmelstein, Murray & Oram LLP

[57] ABSTRACT

In an ultraviolet exposure apparatus, substances contained in an atmosphere contacting a lens surface are reduced, the substances generating accumulations on the lens surface. Openings are formed in the wall of a lens barrel to allow the atmosphere to be replaced by a proper gas. The proper atmospheric gas may be a gas not containing oxygen such as a nitrogen gas, or clean air obtained by intentionally generating accumulations by applying ultraviolet light to source air. A ultraviolet light source is preferably cooled by a cooling system different from the cooling system of a lens optical system.

20 Claims, 11 Drawing Sheets

UV EXPOSURE WITH ELONGATED SERVICE LIFETIME

BACKGROUND OF THE INVENTION a) Field of the Invention

The present invention relates to an optical system using an ultraviolet light source, and more particularly to an exposure technique for use in manufacturing semiconductor devices, particularly an exposure technique using a stepper exposure apparatus having a reduction exposure system.

b) Description of the Related Art

An exposure technique used for forming patterns plays an important roll in semiconductor manufacturing technologies. A stepper exposure apparatus reduces the size of a pattern on a reticle or mask (in this specification, they are collectively called a reticle) by 1/10 to 1/5, and focusses the pattern on an exposure subject such as a photoresist film on a semiconductor wafer.

In order to obtain a high resolution sufficient for realizing a narrow pattern width of highly integrated and miniaturized semiconductor devices, the wavelength of exposure light of a stepper exposure apparatus has shortened from the g line to i line of mercury, to KrF excimer laser beam, and to ArF excimer laser beam. As the wavelength of light is shortened, a photon energy increases in inverse proportion with the wavelength and may become equal to or larger than an excitation energy required for a general chemical reaction.

Ultraviolet light used for the exposure has a high photon energy and chemically changes the characteristics of an exposed photosensitive member such as a photoresist film. It is not evident that ultraviolet rays affect only the photosensitive member and do not affect other elements.

It is necessary to cool a lamp which radiates ultraviolet light. Conventionally, the lamp has been cooled by forcibly flowing air. If a cooling ability becomes insufficient, the lifetime of the lamp is shortened and the amount of light radiation is reduced. Clean air filtered by a filter has been used as a cooling medium if an exposure apparatus is operated in a clean room.

In a long term use of a stepper exposure apparatus, an illuminance of an exposure surface lowers with time and scattering light is generated. Such a disorder is affirmed only after the exposure apparatus has been used for a long time.

Figure 13A:
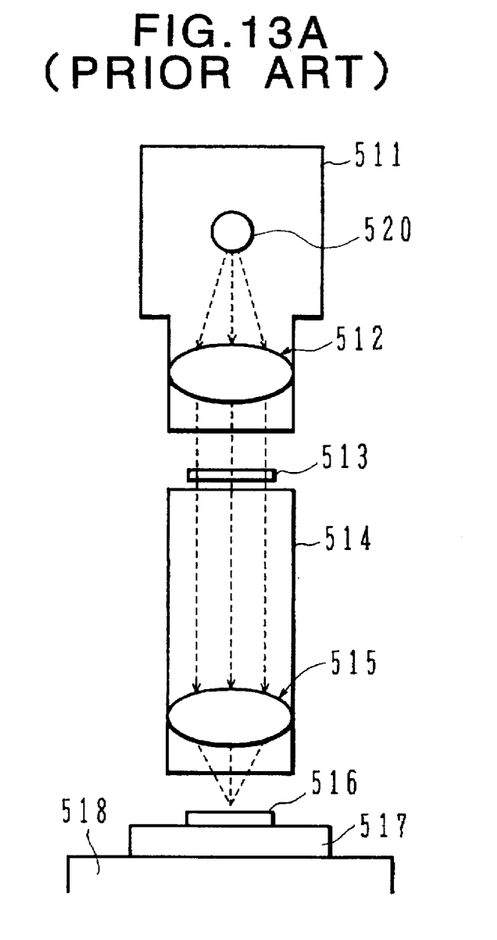
FIGS. 13A and 13B are schematic cross sectional views showing conventional optical systems for a reduction projection exposure system.
Figure 13B:
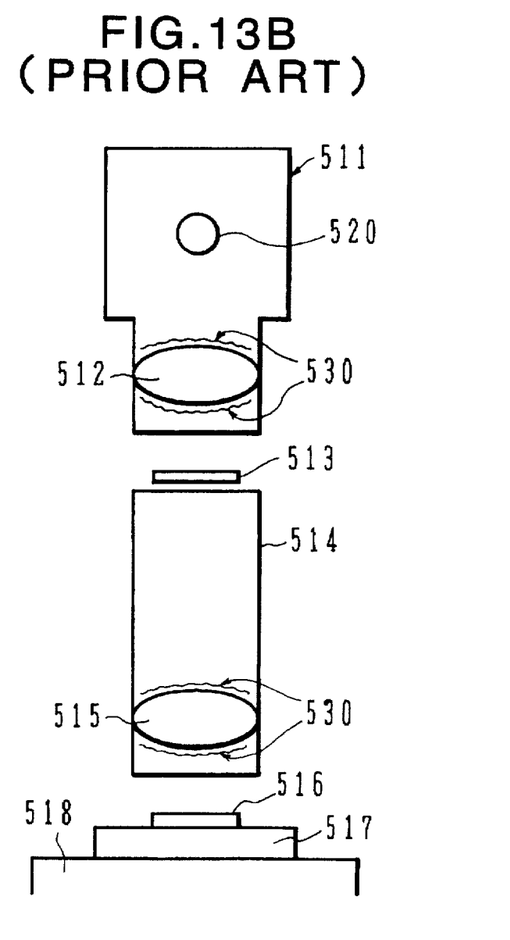

FIGS. 13A and 13B show a stepper exposure system according to a conventional technique. FIG. 13A shows the stepper exposure system as a new article, and FIG. 13A shows the stepper exposure system after a long term use.

Referring to FIG. 13A, an illuminating lens barrel 511 accommodates a lamp 520 for radiating ultraviolet light and a condenser lens group 512 for condensing light from the lamp 520 and applying it to a reticle 513. Light emitted from the lamp 520 and condensed by the condenser lens group 512 is applied to the reticle 513.

Light passes through openings formed in the reticle 513, and propagates in a projecting lens barrel 514 to a reduction lens group 515 by which the light is condensed and applied to a photoresist film coated on a semiconductor wafer 516 and exposes the photoresist film. The semiconductor wafer 516 is placed on an X-Y stage 517 fixed on a base 518.

After the stepper has been used for a long time, blurs 530 are accumulated on the surfaces of the condenser lens group 512 of the illuminating system and the reduction lens group 515 of the projecting system, as shown in FIG. 13B. Because the blurs 530 shield and scatter light and degrade the performance of the total optical system, the total performance of the stepper is lowered. It has been found that a g line stepper exposure apparatus used for about ten years by the assignee has blurs on the reduction lens system and an extremely lowered transmittance (and therefore a lowered illuminance on an exposure surface). Such degradation of the lens system lowers the exposure performance, resulting in a disability of using the lens system.

As the wavelength of ultraviolet light is shortened, another problem has arisen. This problem is a phenomenon that accumulations are generated near or at an optical path of an exposure apparatus even if it is used in a clean room. A focussing system of an exposure apparatus is highly precise and expensive. Accumulations on the optical system greatly damage its performance. Although it has been affirmed that accumulations contain ammonium sulfate, the mechanism of generating accumulations is still not certain.

SUMMARY OF THE INVENTION

It is an object of the present invention to provide an ultraviolet light exposure method which provides less performance degradation even after a long term use.

It is another object of the present invention to provide an optical system using ultraviolet light which system provides less performance degradation even after a long term use.

According to one aspect of the present invention, there is provided a method of exposing a subject to light radiated from a light source and passed through an optical path including a lens and through a mask, wherein the exposure is performed by contacting at least one surface of the lens disposed along the optical path with an atmosphere having reduced substances changeable to accumulations.

Since the exposure is performed by contacting at least one surface of a lens disposed along the optical path with an atmosphere having reduced substances changeable to accumulations, the lens is not degraded by the atmosphere even ultraviolet light transmits therethrough. As a result, the lifetime of an exposure system using ultraviolet light can be elongated, and the performance of the exposure system can be prevented from being lowered.

According to another aspect of the present invention, there is provided an exposure apparatus using ultraviolet light which apparatus includes an ultraviolet lamp, a cooling fluid path surrounding the ultraviolet lamp and forming an independent fluid path for flowing a cooling fluid, the cooling fluid path being adapted to transmit ultraviolet light, an illuminating optical system, and an exposure room coupled to the cooling fluid path for forming a closed space encompassing the illuminating optical system.

The ultraviolet lamp is surrounded by the cooling fluid path and cooled down to a predetermined temperature by the cooling fluid flowing in the cooling fluid path.

Even if the amount of cooling fluid flowing in the cooling fluid path is changed, the external area, particularly the exposure room, is not adversely affected. The exposure room forms a closed space independently from the cooling fluid path so that external impurities entering the exposure room can be suppressed. It is possible to elongate a lifetime of an ultraviolet lamp of an exposure apparatus, to elongate a lifetime of an illuminating optical system, and to maintain a high precision of the exposure apparatus.

According to a further aspect of the present invention, there is provided a method of running an exposure apparatus using ultraviolet light which apparatus includes a step of cleaning a cooling gas for an apparatus using ultraviolet light by passing the cooling gas through a cleaning region heated to a predetermined temperature and applied with ultraviolet light and by generating accumulations caused by a photochemical reaction in the cleaning region, and a step of using the cleaned cooling gas for cooling the apparatus using ultraviolet light.

A cooling gas for an apparatus using ultraviolet light is cleaned first, and thereafter used for cooling the apparatus. It is therefore possible to reduce the amount of accumulations at the apparatus.

Similar to the inside of the apparatus using ultraviolet light, cleaning of a cooling gas is performed by passing the cooling gas through a heated region applied with ultraviolet light and by positively generating accumulations by a photochemical reaction. Application of ultraviolet light also heats the heated region. Since substances to be photochemically reacted are consumed at the cleaning step, accumulations generated when the apparatus using ultraviolet light is cooled can be reduced correspondingly.

In the above manner, accumulations generated by an ultraviolet light photochemical reaction whose mechanism is not still uncertain, can be effectively reduced. Therefore, accumulations at the optical system are reduced, and the lifetime of the optical system is elongated.

The other objects, characteristic, and advantages of the present invention will become more apparent from the following detailed description of embodiments when read in conjunction with the accompanied drawings.

DETAILED DESCRIPTION OF THE PREFERRED EMBODIMENTS

It is hypothesized that three elements including source material, temperature, and ultraviolet light are the requirements for generating accumulations. Some of these three elements are required to be changed in order to reduce accumulations to be generated by the exposure of ultraviolet light.

Using ultraviolet light is essential for an optical apparatus designed to use ultraviolet light. A temperature rise of such an optical apparatus is inevitable because the apparatus radiates ultraviolet light and applies it to optical components. Therefore, only one method is available, e.g., to reduce the amount of source materials of accumulations to be generated by the exposure of ultraviolet light.

The mechanism of how accumulations are generated by ultraviolet light exposure is not still certain. Therefore, it is not clear that what kind of processing can reduce the amount of source materials of accumulations.

The present inventors have analyzed degraded performances of lenses by using X-ray photo-electron spectroscopy (XPS), and have found that oxides of C, S, Sn, Mg, Si, and the like are accumulated on the surface of the lens system. From the analyses of new lens systems of the same kind, such oxides were not found excepting Si oxide. It can be judged from the above analyses that these oxides are derived from components of an atmospheric gas and from components of out-gas from the lens assembly. Nitrides of these elements were not found.

If an oxidation reaction can be suppressed, it can be assumed that degradation of an exposure optical system can be prevented. It is possible to prevent accumulations of oxides by encompassing the lens surface with non-oxidizing gas or by extracting oxygen from atmospheric gas encompassing each lens.

Non-oxidizing gases include, for example, nitrogen gas, inert gases such as argon gas and helium gas, and reducing gases such as hydrogen gas. Atmospheric gases with reduced oxygen gas include, for example, the above-cited gases, and low pressure atmospheric gases. Of these gases, the reducing gases such as hydrogen gas are dangerous because they have a possibility of flashing. The low pressure atmospheric gases may pose a new problem regarding a mechanical stability of an apparatus. Such problems are not associated with nitrogen gas and inert gases.

Nitrogen gas having a molecular weight (28) close to a molecular weight (29) of air is preferable from the viewpoint that a design of a presently used lens system is not required to be changed and that the optical performance of each lens scarcely changes.

Although inert gas is superior to nitrogen gas in that the former has an extremely low possibility of chemical reactions, nitrogen gas is expected to give a stability similar to inert gas because the analyses of accumulations on lens systems by the present inventors showed no nitride.

A high resolution lens system is assembled while it is adjusted at the same time. The assembled lens system contains air between lenses. In a conventional lens system, it is difficult to fully replace air between lenses by another gas after the lens system has been assembled.

Figure 1:
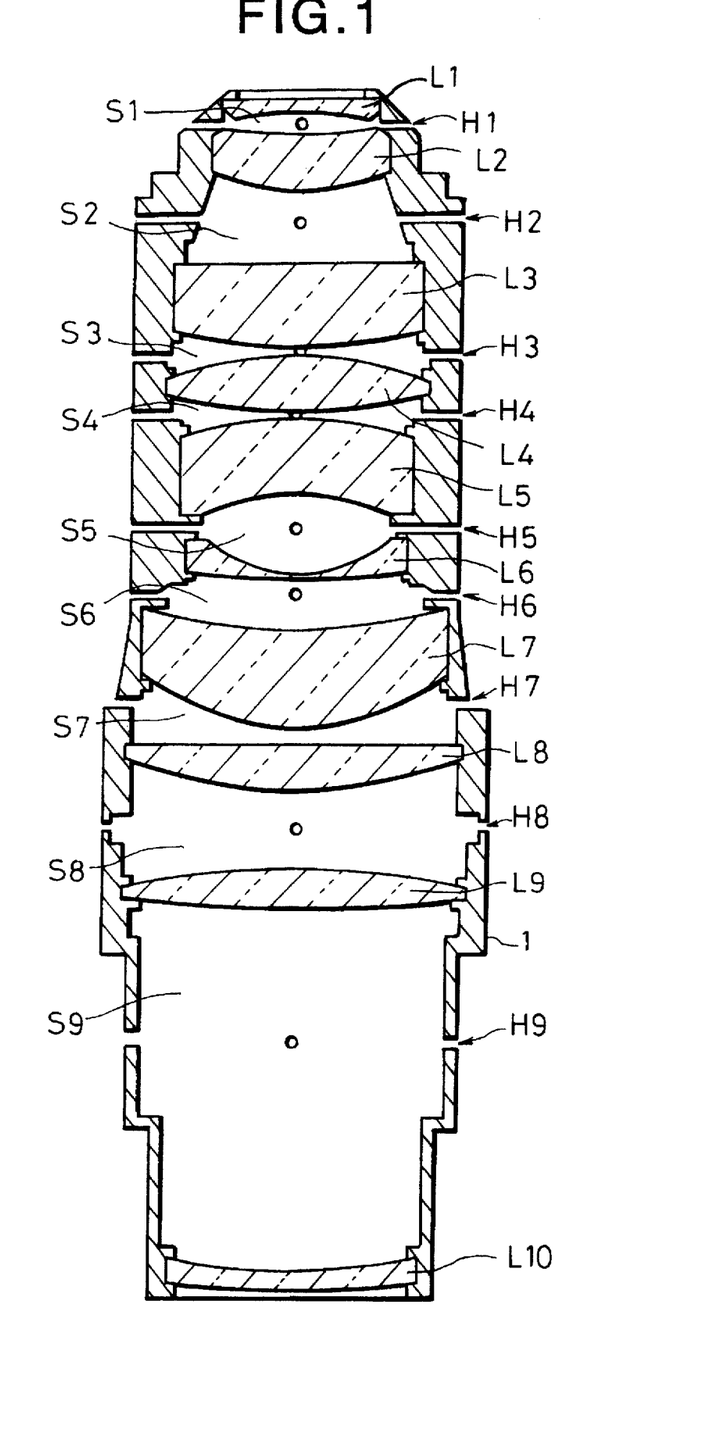
FIG. 1 is a cross sectional view showing a lens system according to the present invention.

FIG. 1 shows a lens system having the structure allowing atmospheric gas between lenses to be easily replaced.

Lenses L1 to L10 constitute a high resolution reduction lens system, and are held by a lens barrel 1. Spaces S1 to S9 are formed between the ten lenses L1 to L10.

The lens barrel 1 is formed with through-holes H1 to H9 which allow the spaces S1 to S9 between respective pairs of adjacent lenses to communicate with the outer space of the barrel 1. Four through-holes H are formed at an interval of about 90 degrees in the barrel wall at each space S between a pair of adjacent lenses. By using these through-holes H as inlet/outlet ports for gas replacement, air in each space S between a pair of adjacent lenses can be replaced by a desired atmospheric gas.

The number of through-holes at each space is not limited to four. Even one through-hole is sufficient for replacing internal atmospheric gas. However, a plurality of through-holes per each space are preferable for an efficient gas replacement.

FIGS. 2A to 2D show configurations of replacing atmospheric gas at each space S between a pair of lenses by desired atmospheric gas such as nitrogen gas.

Figures 2A, 2C:
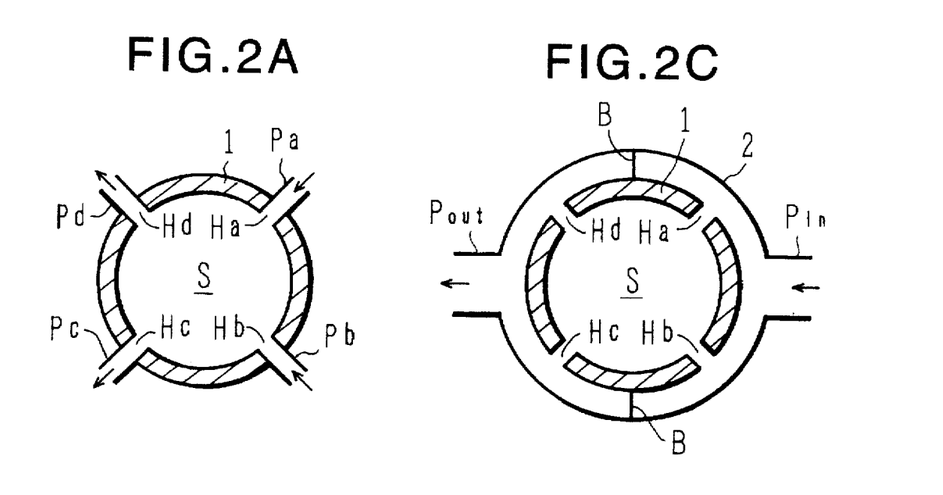
FIGS. 2A to 2D are schematic cross sectional views explaining a replacement of an atmosphere in a space between lenses according to an embodiment of the present invention.

In FIG. 2A, through-holes Ha to Hd are connected to pipes Pa to Pd, two pipes Pa and Pb being used as gas supplying pipes and the other two pipes Pc and Pd being used as gas exhausting pipes. In using the exposure optical system, a desired gas such as nitrogen gas is supplied from the pipes Pa and Pb, and the inner atmospheric gas is exhausted. Air in the space S between lenses can thus be replaced by the desired atmospheric gas.

With the structure shown in FIG. 2A, each through-hole is connected to a pipe. If four through-holes are provided at each space between lenses of a lens group constituted by ten lenses, the total number of through-holes is 36 and the number of pipes is 36.

Figure 2B:
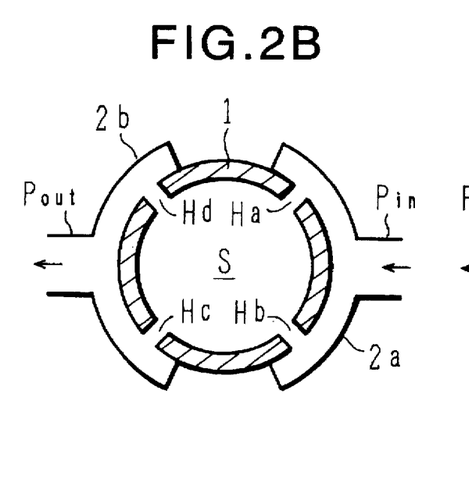

FIG. 2B shows another structure which simplifies a piping work. In FIG. 2B, sheaths 2a and 2b cover the right and left sides of a lens barrel 1 to form gas passages between the outer wall of the lens barrel 1 and the sheaths 2a and 2b. Though-holes Ha and Hb formed in the wall of the lens barrel 1 communicate with the space defined by the sheath 2a, and through-holes Hc and Hd communicate with the other space defined by the sheath 2b. The sheaths 2a and 2b provided for all the spaces S1 to S9 between lenses may be of the same structure.

A pipe $P_{in}$ is connected to the sheath 2a, and another pipe $P_{out}$ is connected to the sheath 2b. By supplying a desired gas from the pipe $P_{in}$ and exhausting the inner atmospheric gas from the pipe $P_{out}$, the atmospheric gas in the spaces S in the lens barrel 1 can be replaced by the desired gas. This structure uses two pipes.

FIG. 2C shows another structure which simplifies a piping work. A lens barrel 1 is covered with a single sheath 2. Similar to FIG. 2B, pipes $P_{in}$ and $P_{out}$ are connected to the sheath 2. The spaces S in the lens barrel 1 communicate with the space in the sheath 2 via the through-holes Ha to Hd. It is therefore possible to replace the atmospheric gas in the spaces S in the lens barrel 1 by a desired atmospheric gas by supplying the desired atmospheric gas from the pipe $P_{in}$ and exhausting the original atmospheric gas from the pipe $P_{out}$. There is a possibility that the atmospheric gas supplied from the pipe $P_{in}$ flows out of the exhaust pipe $P_{out}$ via the space between the wall of the barrel 1 and the sheath 2 without entering the spaces S in the lens barrel 1. It is preferable that in order to reduce this possibility, baffles B are disposed in the sheath 2 to limit the flow of gas directly from the supplying pipe $P_{in}$ to the exhausting pipe $P_{out}$.

Figure 2D:
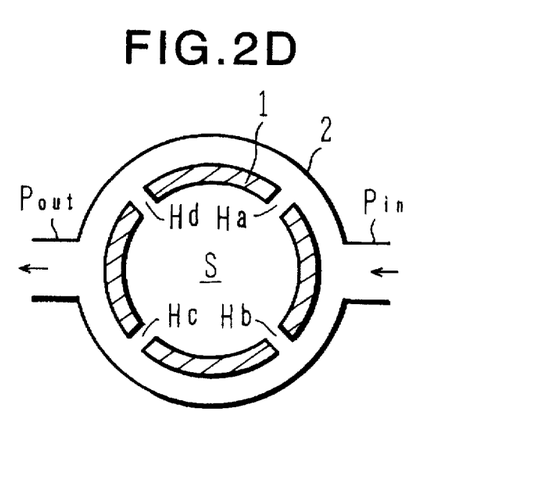

It is also preferable that in order to prevent a force from being unintentionally applied to the lens system, baffles B are not disposed as shown in FIG. 2D. In the structure shown in FIG. 2C, the sheath 2 and the lens barrel 1 may not be contacted but are separated by a small gap. With such a structure, the atmospheric gas in the lens group diffuses and is replaced by a gas having a predetermined oxygen level or less, or the gas in the lens group may be replaced by pure nitrogen gas. A nitrogen gas is supplied to flow at about several l/min during gas replacement and at several tens cc/min after the gas replacement.

FIGS. 3A to 3D show other configurations of atmospheric gas replacement.

Figure 3A:
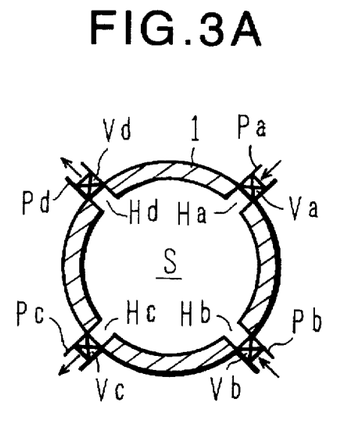
FIGS. 3A to 3D are schematic cross sectional views explaining a replacement of an atmosphere in a space between lenses according to another embodiment of the present invention.

The structure shown in FIG. 3A has a valve V connected to each pipe P of the structure shown in FIG. 2A. After the atmospheric gas in the spaces S between lenses is replaced by a desired atmospheric gas, the valves V are closed to seal the spaces S. By closing the valves V, the spaces S between lenses can be sealed while replacing the atmospheric gas in the spaces S by a desired atmospheric gas.

With this structure, it is desirable that a means for sealing the spaces S containing a replaced gas has a sufficiently high air-tightness for preventing external air from being entering. After once the atmospheric gas in the spaces is replaced by the desired gas, it is not necessary to replace the desired gas each time the apparatus is used, but it is sufficient if the desired gas is replaced at a predetermined time interval.

Figure 3B:
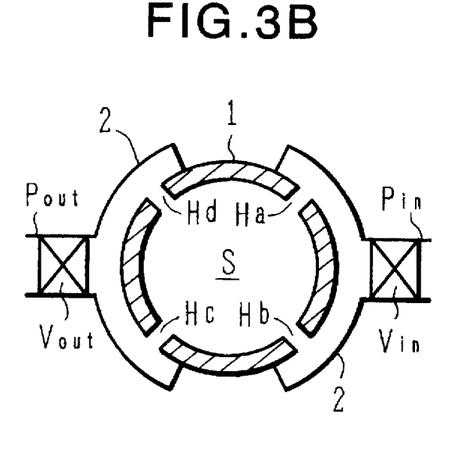

The structure shown in FIG. 3B has a valve V connected to each pipe P of the structure shown in FIG. 2B. Similar to the case of FIG. 3A, after the atmospheric gas in the spaces S between lenses is replaced by a desired atmospheric gas, the valves V are closed to seal the spaces S.

Figure 3C:
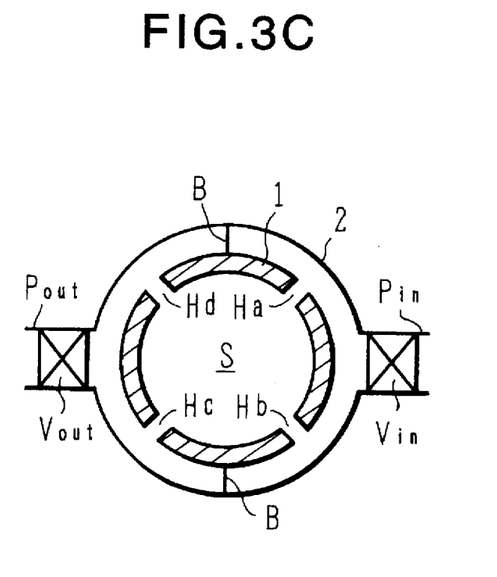
Figure 3D:
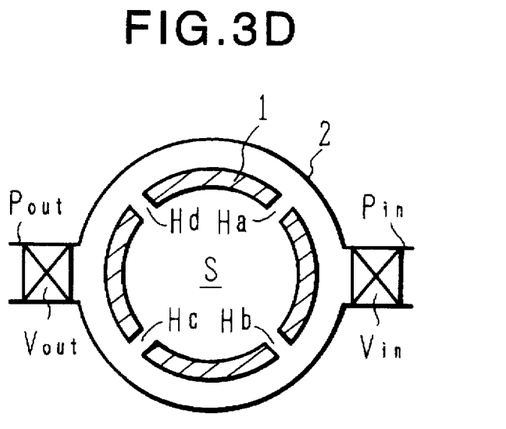

The structures shown in FIGS. 3C and 3D have a valve V connected to each pipe P of the structures shown in FIGS. 2C and 2D. Also in this case, after the atmospheric gas in the spaces S between lenses is replaced by a desired atmospheric gas, the valves V are closed to seal the spaces S.

In the structures shown in FIGS. 3A to 3D, a valve is connected to each pipe to seal the spaces S between lenses by closing the valve after the atmospheric gas in the spaces is replaced by a desired gas. Instead of using a valve, after the atmospheric gas in the spaces S has been replaced, each pipe may be shut or each through-hole may be closed by using sealing material.

With the above structures, it becomes possible to expose ultraviolet light by filling the spaces between lenses of a lens group with non-oxidizing gas or by continuously flowing non-oxidizing gas. The above-structures are applicable not only to a reduction lens system but also to other lens systems using a lens group having a plurality of lenses.

Figure 4A:
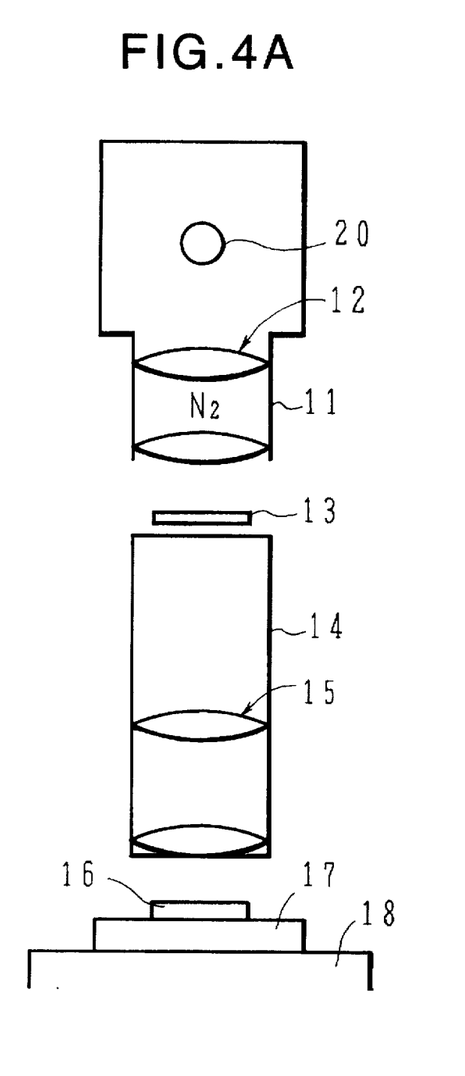
FIGS. 4A and 4B are schematic cross sectional views showing an exposure optical system according to an embodiment of the present invention.
Figure 4B:
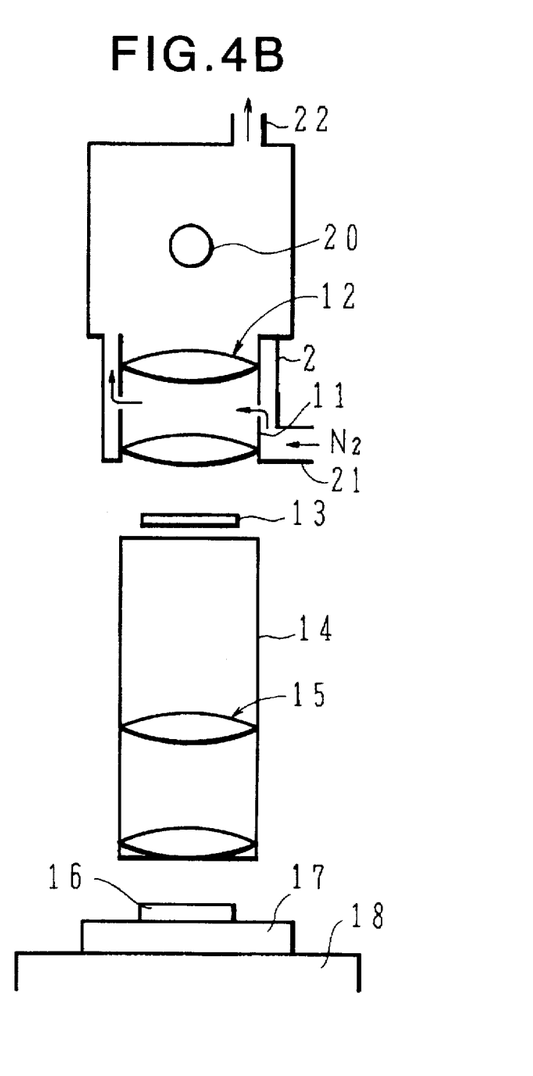

FIGS. 4A and 4B are schematic diagrams showing the structure in which the illuminating system lens group of a stepper exposure system incorporates the above-described structure.

FIG. 4A is a schematic diagram showing the structure in which nitrogen gas is filled in the space between lenses of a condenser lens group 12 of a stepper exposure system.

Light emitted from a lamp 20 passes through a condenser lens group 12 and illuminates a reticle 13. Light passed through the reticle 13 passes through a reduction lens group 15 and is focussed onto a photoresist film on a semiconductor wafer 16 placed on an X-Y stage 17. Reference numeral 18 represents a base for supporting the X-Y stage 17, and reference numerals 11 and 14 represent lens barrels for supporting the condenser lens group and the reduction lens group.

A space between each pair of adjacent lenses of the condenser lens group 12 is filled with nitrogen gas N2.

Although ultraviolet light from the lamp 20 passes through the condenser lens group 12, the space between each pair of adjacent lenses is not oxidized because the atmospheric gas is nitrogen gas, and oxides are not accumulated on the lens surface which is in contact with nitrogen gas.

With this structure, there is a possibility that oxides are accumulated on the surfaces of the outermost lenses of the condenser lens group 12. However, because the surfaces of the outermost lenses can be accessed externally, it is possible to clean the surfaces with accumulations.

The surfaces of lenses defining the inner spaces cannot be accessed after the lens group has been assembled. If oxides are accumulated on these surfaces between lenses, the surfaces cannot be cleaned so that the lens lifetime terminates when the lens performance is deteriorated.

However, with the embodiment structure, the space between each pair of adjacent lenses is filled with nitrogen gas so that oxides are not accumulated, thereby elongating the lifetime of the lens groups.

FIG. 4B is a schematic diagram showing the structure in which nitrogen gas is filled in the space between lenses of a condenser lens group of an illuminating system. Nitrogen gas can be made to flow through the spaces between lenses of the condenser lens group 12, by using the structures shown in FIGS. 2A to 2D.

A lens barrel 11 is surrounded by a sheath 2. Nitrogen gas exhausted from the sheath 2 flows into the space surrounding a lamp 20. Therefore, this space is also prevented from accumulating oxides. Nitrogen gas is supplied from a gas supplying port 21, passes through the spaces between lenses of the condenser lens group 12 and through the space surrounding the lens 20, and is exhausted from a gas exhausting port 22.

With the structures shown in FIGS. 4A and 4B, it is possible to protect the surfaces of lenses of the condenser lens group of the stepper exposure system and to elongate the condenser lens group. With the structure shown in FIG. 4B, accumulations of oxides can be further reduced at the illuminating system.

Figure 5A:
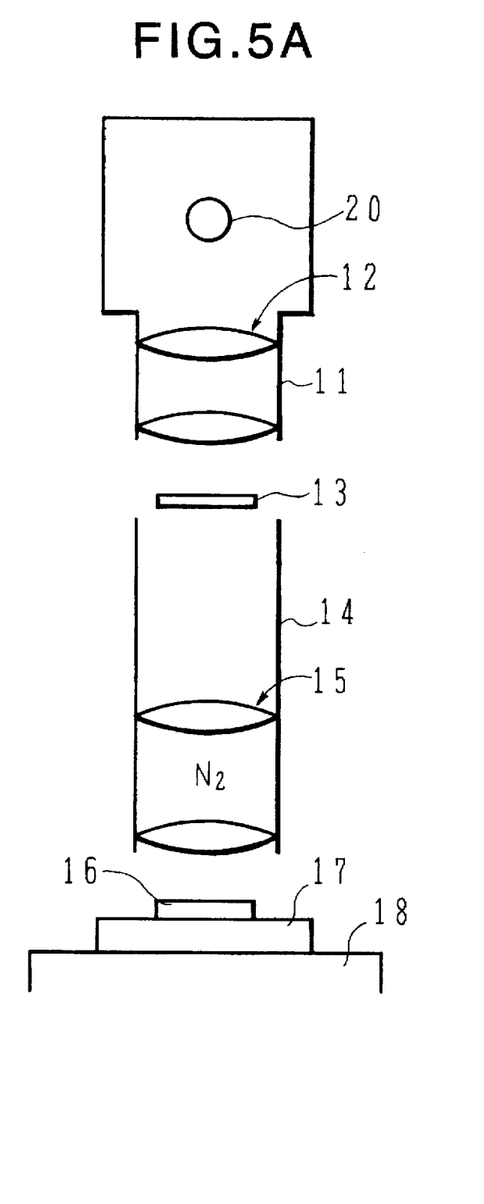
FIGS. 5A and 5B are schematic cross sectional views showing an exposure optical system according to another embodiment of the present invention.
Figure 5B:
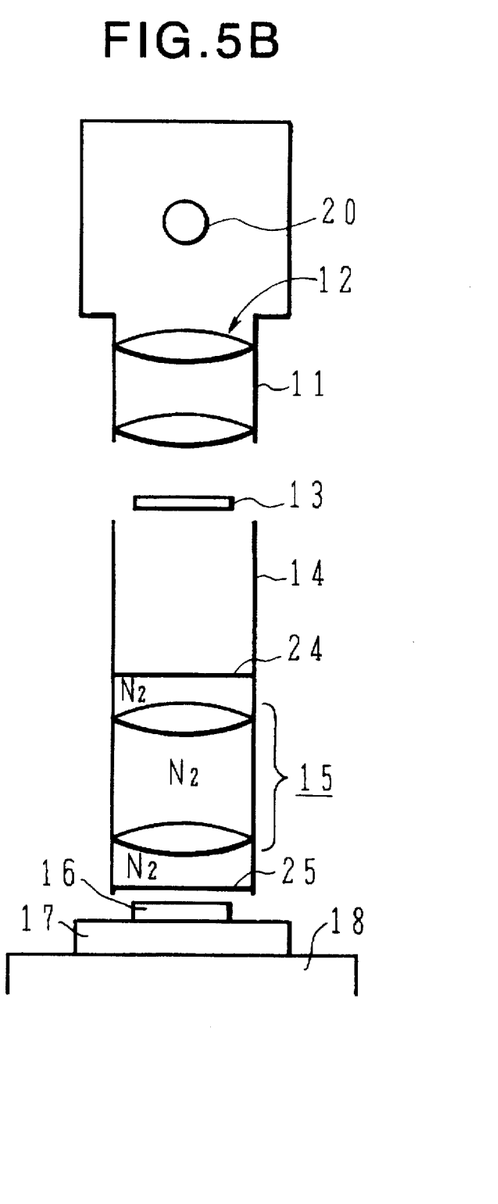

FIGS. 5A and 5B are schematic diagrams showing the structures in which the structures shown in FIGS. 3A to 3D are applied to optical projection systems. In the illuminating system of a stepper exposure system, light emitted from a lamp 20 passes through a condenser lens group 12 supported by a lens barrel 11 and illuminates a reticle 13. Light passed through the reticle passes through a reduction lens system 15 supported by a lens barrel 14, and is focussed onto a photoresist film on a semiconductor wafer 16.

With this structure, the space between each pair of adjacent lenses of the reduction lens system 15 of the optical projection system is filled in with nitrogen gas. The lens surfaces in contact with nitrogen gas is prevented from accumulations of oxides, and the lens performance can be maintained good for a long period.

With the structure shown in FIG. 5A, the surfaces of the outermost lenses of the reduction lens system cannot be protected from accumulations of oxides. Although the surfaces of the outermost lenses are accessible externally and can be cleaned, it is desirable that these surfaces are free from accumulations of oxides.

FIG. 5B shows the structure which also protects the surfaces of the outermost lenses of the reduction lens system 15. Pellicles 24 and 25 of thin films which scarcely change the characteristics of an optical path are disposed at the upstream and downstream of the reduction lens system 15, to thereby seal the spaces between the surfaces of the outermost lenses and the external atmosphere. In this structure, the spaces between the surfaces of the outermost lenses of the reduction lens system 15 and the pellicles 24 and 25 are also filled in with nitrogen gas. With this structure, all the surfaces of lenses of the reduction lens system 15 can be protected from accumulations of oxides. The pellicles 24 and 25 are replaced by new ones when necessary.

Figure 6A:
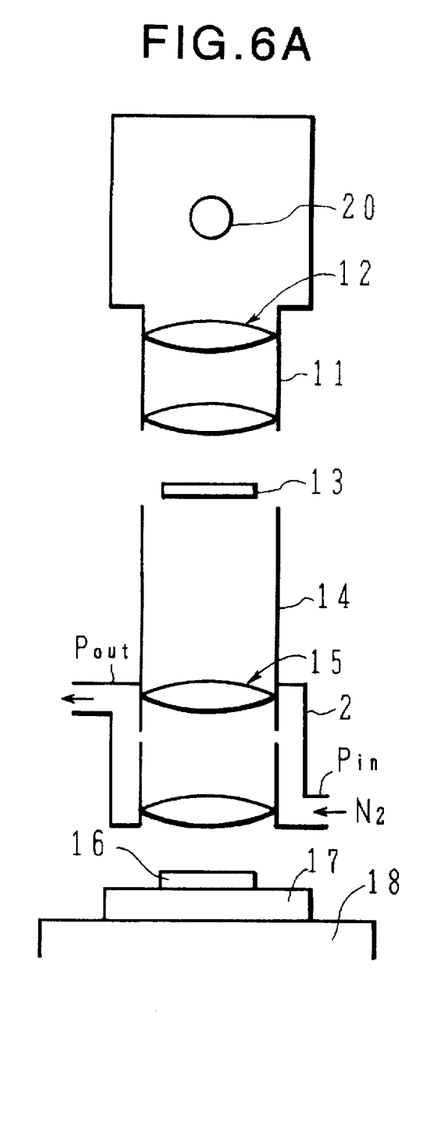
FIGS. 6A and 6B are schematic cross sectional views showing an exposure optical system according to a further embodiment of the present invention.
Figure 6B:
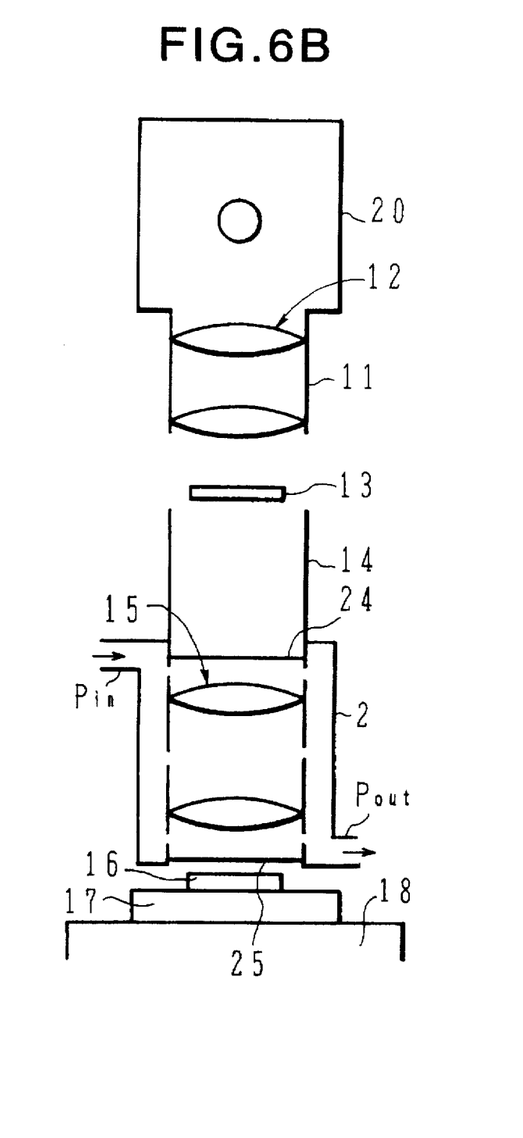

FIGS. 6A and 6B show the configurations in which the structures shown in FIGS. 2A to 2D are applied to a projecting lens system.

In FIG. 6A, nitrogen gas is supplied via the space between a lens barrel 14 and a sheath 2 into the space between each pair of lenses of a reduction lens system 15 supported by the lens barrel 14. Nitrogen gas passed through the space between lenses is exhausted from an exhausting pipe $P_{out}$.

In the structure shown in FIG. 6B, the surfaces of the outermost lenses of the reduction lens system 15 are also protected by using pellicles 24 and 25. The pellicles 24 and 25 are disposed at the positions spaced apart from the surfaces of the outermost lenses of the reduction lens system 15 to thus form a semi-sealed space between the pellicles 24 and 25 and the surfaces of the outermost lenses.

Nitrogen gas supplied from a supplying pipe $P_{in}$ flows into the spaces between the pellicles 24 and 25 and the surfaces of the outermost lenses, as well as the spaces between lenses, and is exhausted from the exhausting pipe $P_{out}$. With this structure, all the surfaces of lenses of the reduction lens system 15 can be protected from accumulations of oxides. Similar to the structure shown in FIG. 5B, the pellicles 24 and 25 are replaced by new ones when necessary.

A reduction lens system has a high resolution so that its performance is degraded if there is any disturbance of a reflectance of a space. In the structures shown in FIGS. 6A and 6B, therefore, it is preferable to stably flow a constant amount of gas (e.g., several tens cc/min).

In the above embodiments, an atmospheric gas in a space encompassing a lens is replaced by nitrogen gas. Other non-oxidizing gases may be used in place of nitrogen gas. For example, inert gas of group VIII of the periodic table may be used. If an inert gas is used, it is necessary to adjust the characteristics of an optical system so as to match a replaced inert gas, because the reflectance of an inert gas is different from the reflectance of air.

If the space encompassing a lens is to be filled in with a low pressure atmosphere, oxygens which generate oxides reduce in amount so that accumulations of oxides also reduce. A reducing gas may be used as a non-oxidizing atmosphere. Hydrogen gas for example may be used as a reducing gas.

The above structures are not limitative. For example, similar structures may be used not only for a reduction projection exposure system but also for other systems so long as they are high quality lens groups using ultraviolet light. It is apparent to those skilled in the art that various modifications, improvements, combinations and the like can be made.

In the above embodiments, gas in contact with an optical system, particularly a lens, has been replaced by gas which does not contain oxygens. In a conventional ultraviolet light exposure optical system, a great amount of cooling air is flown in order to cool an ultraviolet lamp and an illuminating system. If nitrogen gas is used in place of air, a great amount of nitrogen gas is required. If the cooling degree becomes insufficient, the lifetime of an ultraviolet lamp is shortened.

Figure 7:
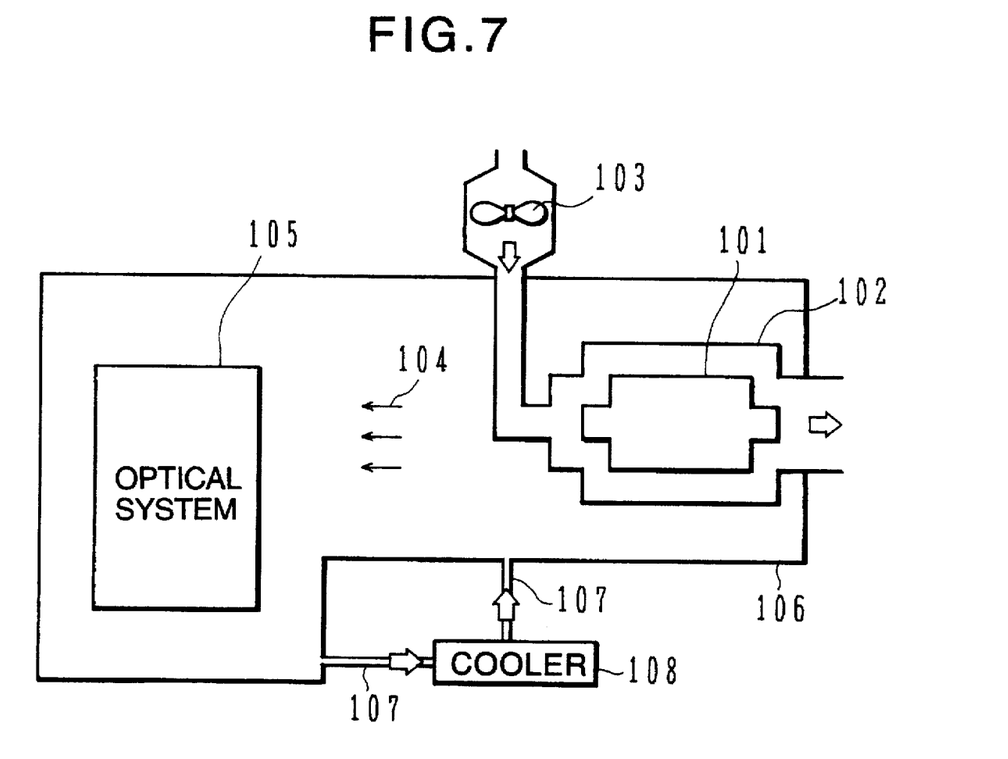
FIG. 7 is a schematic cross sectional view showing the structure of an exposure apparatus according to an embodiment of the present invention.

FIG. 7 is a schematic diagram showing the structure of an exposure system according to another embodiment of this invention. An ultraviolet lamp 101, for example, a mercury lamp, is disposed in a cooling fluid path 102.

The cooling fluid path 102 is at least partially made of quartz glass and can transmit ultraviolet light. On the inlet side of the cooling fluid path 102, a gas supplying fan 103 for supplying a necessary amount of gas is disposed.

Cooling gas to be conveyed along the cooling fluid path 102 may be clean air in a clean room, or external air. Since the cooling fluid path 102 is shielded from the outside, the cleanness of the clean room can be maintained even if external air is conveyed in the cooling fluid path 102.

An exposure room 106 is formed to accommodate the ultraviolet lamp 101. The exposure room 106 is coupled to the cooling fluid path 102 and forms a closed space independent from the clean room.

An optical system 105 is disposed in the exposure room 106 which system performs a predetermined exposure process by using ultraviolet rays 104 radiated from the ultraviolet lamp 101. The optical system 105 is, for example, an illuminating optical system of a reduction exposure system, and preferably the optical system 105 has an opening in the lens barrel as shown in FIG. 4B.

Gas in the exposure room 106 circulates via a gas circulating path 107 and a cooler 108. The optical system 105 is maintained at a predetermined temperature by the circulating gas cooled by the cooler, although it is heated by applied ultraviolet rays 104. In the following description, it is assumed that the optical system 105 is an illuminating optical system.

Conventionally, both an ultraviolet lamp 101 and an illuminating optical system 105 have been cooled by the same air. Therefore, if the lamp 101 is to be cooled sufficiently, a large amount of air also flows to the illuminating optical system, resulting in a difficulty of controlling the temperature of the illuminating optical system 105 at a high precision.

With the embodiment structure, the exposure room 106 and the ultraviolet lamp 101 are housed in separate spaces. Accordingly, a flow of gas circulating through the exposure room 106 can be reduced to an amount only necessary for cooling the illuminating optical system 105, thereby providing a high precision temperature control. It is therefore possible to minimize a change in thermal expansion and reflectance with temperature and to improve a precision of the illuminating optical system with ease.

By using a proper gas such as inert gas as the fluid circulating through the exposure room 106, it is possible to reduce accumulations on the illuminating optical system 105 to be caused by chemical reactions. If clean air is used as the cooling medium circulating through the exposure room 106, the cooling medium circulates via the exposure room 106 in repetition. After impurities which causes accumulations are once oxidized, accumulations newly formed are rare.

Figure 8A:
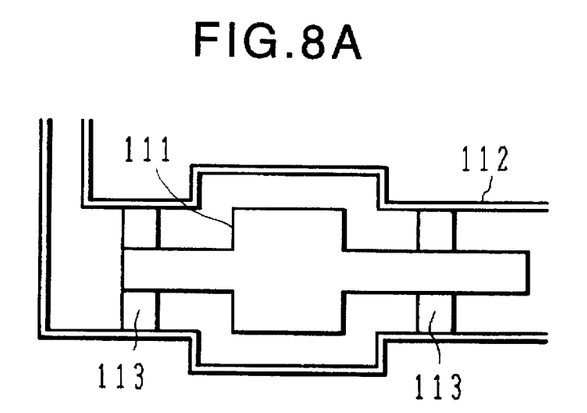
FIGS. 8A to 8C are schematic cross sectional views showing the structure of a cooling fluid path used in the embodiment shown in FIG. 7.
Figure 8B:
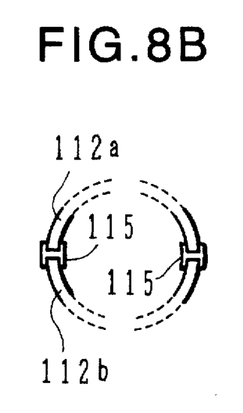

FIGS. 8A and 8B are schematic diagrams showing an exemplary structure of a cooling fluid path. In FIG. 8A, an ultraviolet lamp 111 is fixed to an outer casing 112 by support fins 113 made of fluorine resin such as polytetrafluoroethylene (PTFE) and perfluoroalkoxyl (PFA).

The main part of the outer casing 112 is formed by quartz glass which can transmit ultraviolet rays emitted from the ultraviolet lamp 111. The support fins 113, particularly the support fin 113 on the upstream side, have a plurality of fins slanted relative to the axial direction to provide a function of agitating cooling medium supplied from the upstream.

The fluid agitated by the support fins 113 passes through the circumferential area of the ultraviolet lamp 111, improving a cooling efficiency. Another agitating member may be disposed in the outer casing 112 in addition to the support fins 113.

FIG. 8B is a schematic diagram showing the structure of an outer casing. The main part of the outer casing 112 is made of quartz glass members 112a and 112b having a semi-circular shape and being coupled together by coupling members 115 made of fluorine resin. The coupling member 115 has preferably a hermetic structure.

By forming the main part of the outer casing by a plurality of components, accumulations on the outer casing can be easily cleaned by disassembling the outer casing. Since the ultraviolet lamp 111 can be cooled by a sufficient amount of cooling medium, it can have a long lifetime.

Figure 8C:
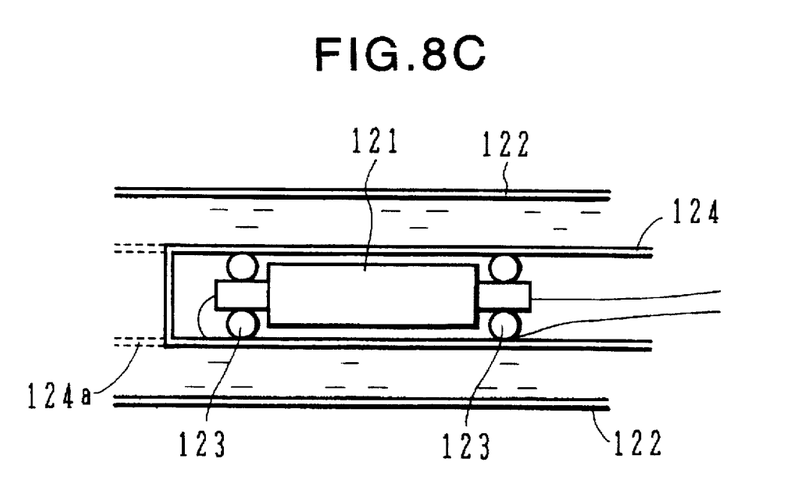

FIG. 8C shows an exemplary structure of a cooling fluid path capable of improving a cooling efficiency. In this structure, the cooling fluid path has a double-tube configuration including an outer casing 122 and an inner casing 124.

A fluid path is formed between the outer and inner casings 122 and 124. Liquid cooling medium allowing ultraviolet rays to transmit, e.g., pure water, may be conveyed in this path.

The inner casing 124 for accommodating a ultraviolet lamp 121 may be a single ended tube as indicated by solid lines, or an open tube constituting the double-tube configuration at the main part of the cooling fluid path as indicated by broken lines.

The ultraviolet lamp 121 in the inner casing 124 is supported by support rings 123. Gas in the inner casing 124 may be continuously flown or may be made immobile.

The liquid cooling medium flowing near the ultraviolet lamp 121 improves the cooling ability of the ultraviolet lamp 121. The outer and inner casings 122 and 124 are made of, for example, quartz glass, so as to sufficiently transmit ultraviolet rays emitted from the ultraviolet lamp 121.

The structure shown in FIG. 8C using liquid cooling medium may be the structure similar to an ultraviolet germicidal mechanism of a pure water producing apparatus.

With the above embodiment structure, the ultraviolet lamp has a sufficient cooling ability, an improved luminous efficiency, and an elongated lifetime. By flowing a circulating cooling gas in the illuminating optical system, accumulations can be reduced.

Furthermore, since the illuminating optical system and the ultraviolet lamp are independently cooled, the temperature of the illuminating optical system can be controlled at a high precision, and the patterning precision at the illuminating system can be maintained high.

The inventors have studied a use of gas which is inexpensive and easy to obtain abundantly, such as air, and a purification of gas by positively generating accumulations in advance. Even if it is difficult to remove oxygens from air, it is possible to remove oxidizing substances contained in air.

Figure 9:
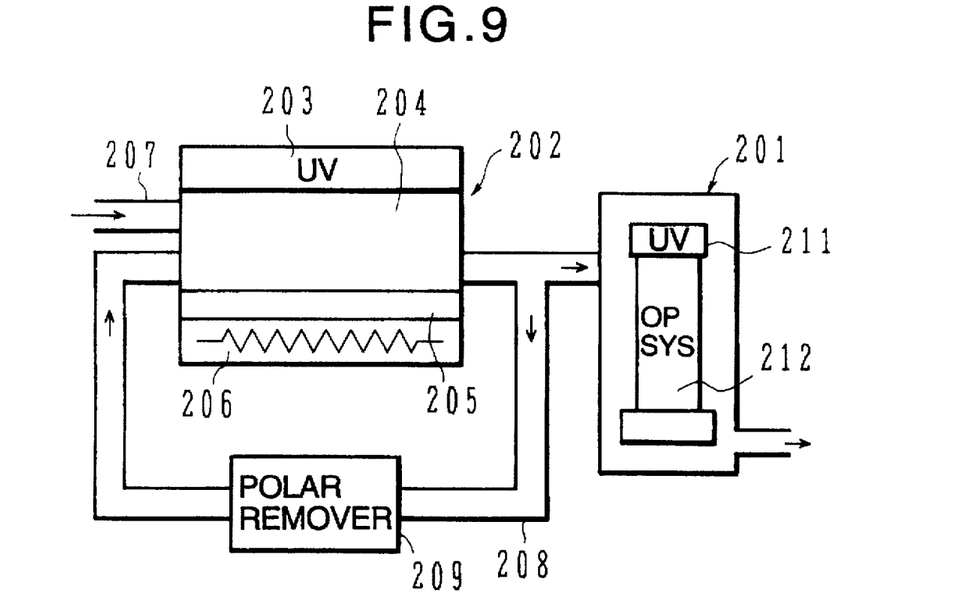
FIG. 9 is a schematic diagram showing the structure of an apparatus using ultraviolet light according to an embodiment of the present invention.

FIG. 9 is a schematic diagram showing the structure of an apparatus using ultraviolet light according to another embodiment of the present invention. The apparatus 201 is a general apparatus using ultraviolet light, such as a reduction projection exposure system. This apparatus includes an ultraviolet lamp 211 and an optical system 212. It is necessary to cool the ultraviolet lamp 211. It is preferable to cool also the optical system 212 because it is heated by the exposure of ultraviolet light. The optical system 212 preferably has a lens barrel with an opening such as shown in FIGS. 4A, 6A, and 6B.

A gas cleaner 202 includes an ultraviolet lamp 203, a gas flow path 204 to which ultraviolet rays radiated from the ultraviolet lamp 203 are applied, a precipitation region 205 formed along the gas flow path 204, and a temperature regulator 206 for regulating the temperature of the precipitation region 205.

An inlet of the gas flow path 204 is connected to a source gas supplying port 207, and its outlet is connected to an apparatus 201 using ultraviolet light. The source gas is fed back to the inlet via a gas circulating path 208. Adsorbent is accommodated in the gas circulating path 208 which is coupled to a polar gas remover 209 for removing polar gas components.

Source gas introduced from the source gas supplying port 207 is exposed with ultraviolet rays at the temperature-controlled gas flow path 204, and precipitates are accumulated on the precipitation region 205. The source gas whose precipitates have been removed becomes clean. The clean gas is used as cooling gas for the apparatus 202 using ultraviolet light. The cleanness of the source gas improves as it is circulated via the gas circulating path 208 to the gas flow path 204 and precipitates are accumulated on the precipitation region 205.

In the structure shown in FIG. 9, after the gas cleaned by the gas cleaner 202 is used by the apparatus 201, it is exhausted without reusing it. Assuming that substances accumulated as precipitates are impurities, the gas used for cooling the apparatus 201 is far purer than the source gas, excepting that it is heated when cooling an ultraviolet lamp of the apparatus 201.

Figure 10:
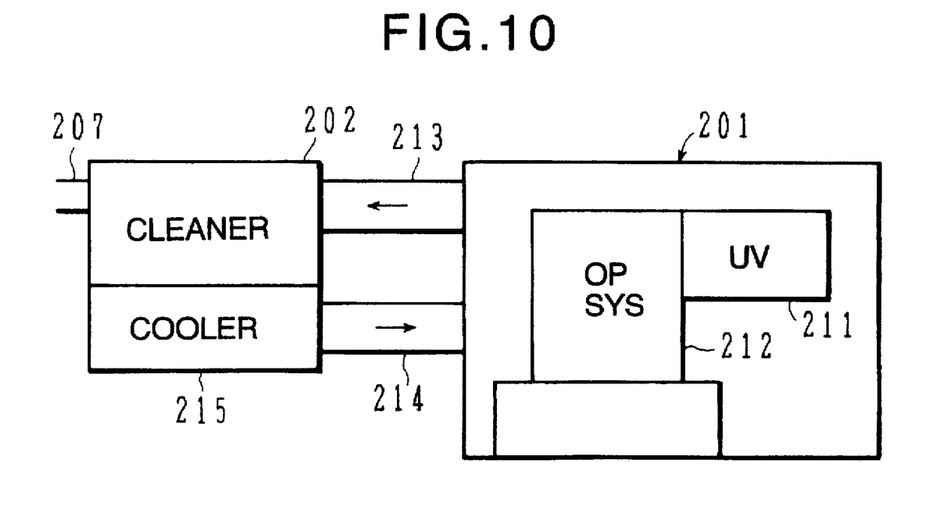
FIG. 10 is a schematic diagram showing the structure of an apparatus using ultraviolet light according to another embodiment of the present invention.

FIG. 10 shows another embodiment wherein gas used for cooling an apparatus using ultraviolet light is recycled. An apparatus 201 using ultraviolet light includes an ultraviolet lamp 211 and an optical system 212 for focussing an image onto a subject in the form of ultraviolet light.

Gas used for cooling the ultraviolet lamp 211 is returned back to a gas cleaner 202 via a gas flow path 213. The gas cleaner 202 cleans the gas returned from the apparatus 201 and source gas supplied from a source gas supplying port, the cleaned gas being sent to a cooler 215.

The cooler 215 cools the gas supplied from the gas cleaner 202 down to a predetermined temperature, and supplies it via a gas flow path 214 to the apparatus 201. This gas cools the ultraviolet lamp 211 and the like of the apparatus 201, and is again returned via the air flow path 213 to the gas cleaner 202.

Supplementary source gas is supplied from a source gas supplying port 207 in order to compensate for the amount of gas reduced during the circulation by leakage or the like.

By recycling the cooling gas, the components accumulated by photochemical reactions gradually reduce so that the cleanness of the gas gradually becomes better.

In the embodiments shown in FIGS. 9 and 10, the apparatus 201 using ultraviolet light and the gas cleaner 202 use different ultraviolet lamps. The lamps are not necessarily used independently by the apparatus 201 and the gas cleaner 202.

Figure 11:
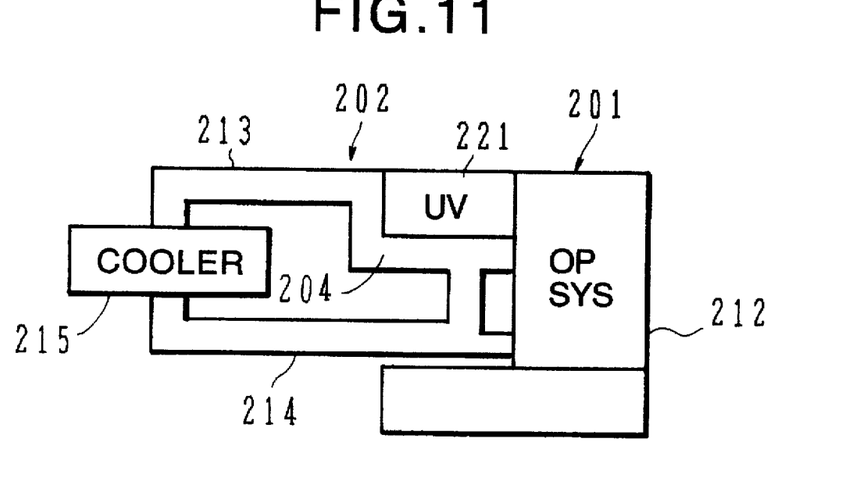
FIG. 11 is a schematic diagram showing the structure of an apparatus using ultraviolet light according to a further embodiment of the present invention.

FIG. 11 is a schematic diagram showing the structure of an apparatus using ultraviolet light according to another embodiment. An apparatus 201 using ultraviolet light includes an ultraviolet lamp 221 and an optical system 212.

The ultraviolet lamp 221 is used also as a constituent element of a gas cleaner 202. More particularly, a gas flow path 204 is disposed around the ultraviolet lamp 221 and forms a gas circulating path with a gas flow path 213, a cooler 215, and another gas flow path 214. A polar gas remover like that shown in FIG. 9 may be connected.

Circulation of gas in the gas circulating path gradually improves the cleanness of the gas because precipitates are accumulated by photochemical reactions. The cleaned gas is used for cooling the optical system 212.

The ultraviolet lamp 221 is exposed to the gas having a low cleanness at the initial running stage, and precipitates may be accumulated on the surface thereof. However, since the ultraviolet lamp 221 is not expensive as compared to the optical system, the lamp 221 can be replaced by a new one when necessary. Precipitates are less accumulated on the optical system 212 because it is cooled by clean gas.

In the above embodiments, a single gas cooler is used for cleaning cooling medium. The circulating cooling medium has a high cleanness, whereas source gas has a low cleanness. If both the gases are cleaned by the same gas cleaner, a load on the gas cleaner becomes too large.

Figure 12:
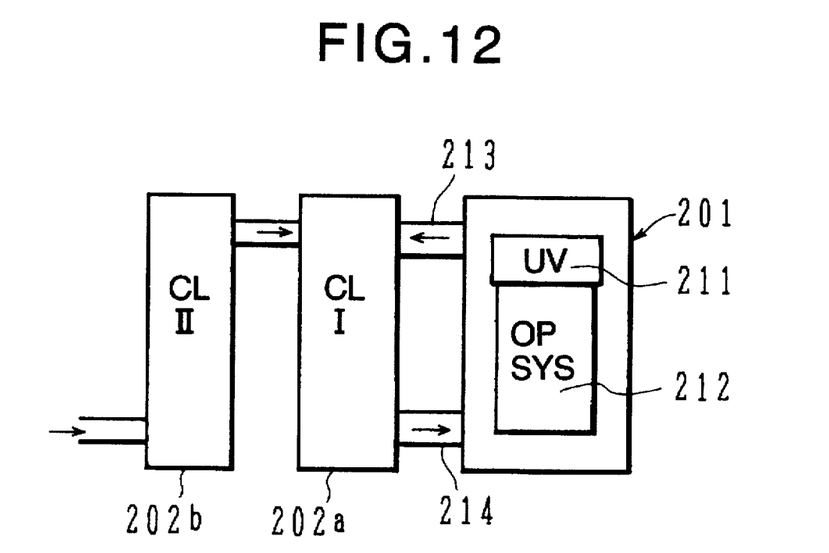
FIG. 12 is a schematic diagram showing the structure of an apparatus using ultraviolet light according to a still further embodiment of the present invention.

FIG. 12 is a schematic diagram showing the structure of an apparatus using ultraviolet light according to another embodiment. Similar to the above embodiments, an apparatus 201 using ultraviolet light includes an ultraviolet lamp 211 and an optical system 212.

A first gas cleaner 202a can process a large flow of gas, and is connected via gas flow paths 213 and 214 to the apparatus 201. Cleaned cooling gas is circulated to cool the optical system 212 and ultraviolet lamp 211. In this case, the amount of cooling gas reduces at the apparatus by leakage or the like.

A second gas cleaner 202b is supplied with source gas such as external air, cleans it and supplies the highly purified gas to the first gas cleaner 202a. The first and second gas cleaners have the same structure as the above-described embodiments.

The first gas cleaner 202a processes a large flow of gas. However, the gas to be processed by the first gas cleaner has a high cleanness so that the requirements of the first gas cleaner 202a for maintaining a high cleanness are not so severe.

On the other hand, it is necessary for the second gas cleaner 202b to clean the gas having a low cleanness and to obtain a gas having a high cleanness. However, a gas flow to be processed by this cleaner 202b is small so that the requirements of the second gas cleaner 202b are not so strict.

In the embodiments shown in FIGS. 9 to 12, instead of air, gas not containing oxygen such as nitrogen gas may be used. The structures shown in FIGS. 9 to 12 may be used only for cooling the optical system, by incorporating the structures shown in FIGS. 7, 8A to 8C and additionally providing a cooling system for an ultraviolet lamp.

The present invention has been described in connection with the preferred embodiments. The invention is not limited only to the above embodiments. It is apparent to those skilled in the art that various modifications, improvements, combinations, and the like can be made without departing from the scope of the appended claims.

We claim:

1. A method of exposing a subject to light radiated from a light source and passed through an optical path including a lens and through a mask, wherein the exposure is performed by contacting at least one surface of said lens disposed along said optical path with an atmosphere having reduced substances changeable to accumulations, wherein said atmosphere is circulated and cleaned by exposure to ultraviolet light, and wherein said atmosphere is cooled.

2. A method of exposing a subject to light radiated from a light source and passed through an optical path including a lens and through a mask, wherein the exposure is performed by contacting at least one surface of said lens disposed along said optical path with an atmosphere having reduced substances changeable to accumulations, wherein said atmosphere is circulated and exposed to ultraviolet light, and wherein said atmosphere is circulated at a first loop and cleaned by exposure to ultraviolet light, said atmosphere outputted from said first loop being circulated at a second loop and cleaned by exposure to ultraviolet light.

3. An exposure apparatus using ultraviolet light, comprising:

an ultraviolet lamp;

a cooling fluid path surrounding said ultraviolet lamp and forming a fluid path for flowing a cooling fluid, said cooling fluid path being configured to transmit ultraviolet light;

an illuminating optical system;

an exposure room coupled to said cooling fluid path for forming a closed space encompassing said illuminating optical system; and a gas circulating system for circulating a gas in said exposure room.

4. An apparatus according to claim 3, further comprising means for fixing said ultraviolet lamp relative to said cooling fluid path and agitating said cooling fluid passing through said means, said means being made of fluorine resin.

5. An apparatus according to claim 4, wherein said cooling fluid path includes a plurality of quartz wall members and a plurality of fluorine resin coupling members for coupling said plurality of quartz wall members.

6. An apparatus according to claim 3, wherein said cooling fluid path includes a plurality of quartz wall members and a plurality of fluorine resin coupling members for coupling said plurality of quartz wall members.

7. An apparatus according to claim 3, wherein said cooling fluid path has a double-tube structure having an inner tube and an outer tube, and wherein said ultraviolet lamp is disposed in said inner tube.

8. An apparatus according to claim 3, wherein said gas circulating system includes a temperature regulator.

9. A method of running an exposure apparatus using ultraviolet light, said method comprising the steps of:

cleaning a cooling gas for an apparatus using ultraviolet light by passing the cooling gas through a cleaning region heated to a predetermined temperature, by applying ultraviolet light to said gas, and by generating accumulations caused by a photochemical reaction in said cleaning region; and using said cleaned cooling gas for cooling said apparatus using ultraviolet light.

10. A method according to claim 9, further comprising a step of automatically and spontaneously cleaning said cleaning region.

11. A method according to claim 10, wherein said cleaned cooling gas used at said cleaned gas using step is again cleaned at said cleaning step.

12. A method according to claim 9, wherein said cleaned cooling gas used at said cleaned gas using step is again cleaned at said cleaning step.

13. A method according to claim 9, wherein said cleaning step flows said cooling gas into a light source unit of said apparatus using ultraviolet light.

14. A method according to claim 9, wherein said cleaning step circulates said cooling gas through said cleaning region.

15. A method according to claim 9, wherein said cleaning step includes a step of cleaning a small amount of source gas by first cleaning means for cleaning gas, and a step of mixing said small amount of cleaned gas with a gas outputted from said apparatus using ultraviolet light, and cleaning a large amount of said mixed gas by second cleaning means for cleaning gas, and circulating said mixed gas through said apparatus using ultraviolet light.

16. An apparatus using ultraviolet light, comprising:

cleaning means for cleaning a gas by passing said gas through a cleaning region, by applying ultraviolet light to said gas, and by generating accumulations caused by a photochemical reaction; and cooling means for using said cleaned gas for cooling an apparatus using ultraviolet light.

17. An apparatus according to claim 16, wherein said cleaning means includes a mechanism for receiving a source gas and circulating said source gas through said cleaning region.

18. An apparatus according to claim 17, wherein said cleaning means and said cooling means use the same ultraviolet lamp.

19. An apparatus according to claim 17, wherein said cleaning means includes temperature regulating means.

20. An apparatus according to claim 17, wherein said cleaning means includes first cleaning means for cleaning a smaller amount of cleaning gas and second cleaning means connected in series to said first cleaning means for cleaning a larger amount of cleaning gas, said second cleaning means constituting a gas loop path at said cooling means.

* * * * *